(12) United States Patent
Park

(10) Patent No.: US 6,191,617 B1
(45) Date of Patent: Feb. 20, 2001

(54) INPUT BUFFER

(75) Inventor: Boo-Yong Park, Seoul (KR)

(73) Assignee: Hyundai Electronics Industries Co., Ltd., Ichon-shi (KR)

(*) Notice: Under 35 U.S.C. 154(b), the term of this patent shall be extended for 0 days.

(21) Appl. No.: 09/132,530

(22) Filed: Aug. 11, 1998

(30) Foreign Application Priority Data

Sep. 6, 1997 (KR) .................................. 97-46089

(51) Int. Cl.[7] .............................................. H03K 19/0175
(52) U.S. Cl. ............................................... 326/83; 326/86
(58) Field of Search ...................................... 326/112, 119, 326/121, 83, 86, 17

(56) References Cited

U.S. PATENT DOCUMENTS

| | | | |
|---|---|---|---|
| 4,672,246 | * | 6/1987 | Kirsch .................................. 307/475 |
| 5,406,139 | | 4/1995 | Sharpe-Geisler ........................ 326/71 |
| 5,880,605 | * | 3/1999 | Mcmanus ................................ 326/86 |

OTHER PUBLICATIONS

Changsik Yoo, et al., "A Static Power Saving TTL-to-CMOS Input Buffer" IEEE Journal of Solid State Circuits, vol. 30 No. 5, May 1995, pp. 616–620.

* cited by examiner

*Primary Examiner*—Michael Tokar
*Assistant Examiner*—A. Tran
(74) *Attorney, Agent, or Firm*—Fleshner & Kim, LLP

(57) ABSTRACT

An input buffer is provided that converts a TTL logic signal to a CMOS logic signal and controls an CMOS output level while eliminating static current consumption even when an external bias voltage is changed. The input buffer improves a low-to-high input signal switching speed. Further, the input buffer can be used for low current and high-speed operation. The input buffer includes an inverter unit having pull-up and pull-down transistors with commonly coupled drains coupled between a power supply voltage and a ground voltage. The input buffer further can include a transistor control unit that receives an output signal of the input buffer to completely turn off the pull-up transistor when the TTL input signal is a high level and rapidly turn on the transistor when the TTL input signal is a low level. The transistor control unit can include a first transistor having a gate and a source for respectively receiving the TTL input signal and the ground voltage, a second transistor having a gate for receiving an output signal from a drain of the first transistor and an output signal from the input buffer and a source for receiving a power supply voltage. A third transistor has a drain commonly coupled to the drain of the second transistor and the gate of the pull-up transistor, a gate that receives an internal power supply voltage, which is lower than an external bias voltage, and a source that receives the input signal.

21 Claims, 3 Drawing Sheets

INPUT BUFFER

BACKGROUND OF THE INVENTION

1. Field of the Invention

The present invention relates to an input buffer, and in particular, to an input buffer that converts an input signal of TTL voltage level to a CMOS voltage level.

2. Background of the Related Art

Generally, a TTL interface is used for interchanging among high-speed communication or current systems rather than a CMOS interface. However, as a CMOS process has been recently applied to a semiconductor integrated circuit, a TTL-to-CMOS interface is widely used.

Accordingly, a CMOS integrated circuit requires an input buffer for converting an input signal of a TTL voltage level to a CMOS voltage level. In particular, to process addresses, data, control signals, etc., a semiconductor memory circuit needs a large number of input buffers for converting a TTL logic signal to a CMOS logic signal and a high processing speed.

FIG. 1 illustrates a first example of a related art input buffer. As shown in FIG. 1, the related art input buffer includes an inverter unit 10 and an inverter 103. The inverter 10 includes a pull-up PMOS transistor 101 and a pull-down NMOS transistor 102 commonly connected between a power supply voltage Vcc and a ground voltage Vss that converts and outputs an externally applied TTL input signal Din. The inverter 103 converts the signal outputted from the inverter unit 10 to an output signal Dout of the input buffer.

The operation of the first related art input buffer will now be described with reference to FIG. 1. When the external TTL input signal Din of a high level is applied to the inverter unit 10, the pull-up PMOS transistor 101 of the inverter unit 10 is turned off and the pull-down NMOS transistor 102 is turned on. Thus, the output signal Dout of the first related art input buffer becomes a high level.

When a TTL input signal Din of a low level is externally applied to the inverter unit 10, the pull-up PMOS transistor 101 of the inverter unit 10 is turned on and the pull-down NMOS transistor 102 is turned off. Thus, the output of the inverter unit 10 becomes a high level and the output signal Dout of the input buffer becomes a low level.

At this time, when the input signal Din of a high level is applied to the inverter unit 10, both of the pull-down NMOS transistor 102 and the pull-up PMOS transistor 101 are turned on, which generates a static current that flows from the power supply voltage Vcc to the ground voltage Vss. Therefore, static power consumption is unavoidable. In this case, the output voltage level of the inverter 10 does not fully become a low level. For example, the output voltage level is maintained at approximately 1V.

To prevent such problems, a size of the PMOS transistor 101 or the NMOS transistor 102 is modified. However, if only the size is modified, it is difficult or impossible to safely drive an internal circuit having a large load capacitance. Therefore, the inverter 103 should be added to the output terminal. Further, more than a single inverter may be added according to the size of the load. However, each additional inverter can create an undesirable gate delay with respect to the input signal Din.

In the first related art input buffer, the static current and the static power mean the current and power in an interval of the TTL input signal Din will not be transited, but maintained at a high or low level.

FIG. 2 illustrates a second example of a related art input buffer. The second related art input buffer example includes the inverter unit 10 of the related art shown in FIG. 1, an inverter 201 for inverting an output signal DOUT, a first switch NMOS transistor 202 for switching. The first switch NMOS transistor 202 has a gate for receiving an output from the inverter 201 and a source for receiving a TTL input signal Din. A cascade second NMOS transistor 203 has a source connected to the drain of the first NMOS transistor 202 and a gate for receiving a first control signal REF1. A first PMOS transistor 204 has a drain connected to the drain of the second NMOS transistor 203, a source for receiving a power supply voltage Vcc, and a gate for receiving a second control signal REF2. The first PMOS transistor 204 operates as a current source. A second PMOS transistor 205 for pull-up reinforcement has a gate for receiving an output from the commonly connected drains of the second NMOS transistor 203 and first PMOS transistor 204. A drain of the second PMOS transistor 205 is connected to an output from the inverter unit 10 and a source is connected to the power supply voltage Vcc.

The operation of the second related art input buffer will be described with reference to FIG. 2. If the size of the pull-down NMOS transistor 102 is greater than the pull-up PMOS transistor 101 to eliminate the consumption of the static current, which is generated when the TTL input signal Din is a high level in the inverter unit 10, the pull-up operation performed by the pull-up PMOS transistor 101 becomes weakened and incapable of driving a large load. For example, the size of the pull-up PMOS transistor 101 can be half than that of the pull-down NMOS transistor 102. To solve the above problem, the second related art input buffer includes not the inverter 103 that leads the gate delay as described in the first related art input buffer, but the PMOS transistor 205 for pull-up reinforcement and the cascade NMOS transistor 203 for controlling the PMOS transistor 205.

That is, the second PMOS transistor 205 is operated by an output of the first NMOS transistor 202 operated in accordance with the output signal Dout of the input buffer, and the cascade second NMOS transistor 203, and the current source first PMOS transistor 204. The second NMOS transistor 203 and the first PMOS transistor 204 are respectively operated in accordance with the externally inputted control signals REF1 and REF2. Further, the output of the second PMOS transistor 205 reinforces the pull-up when the output signal Dout of the input buffer is converted from a low level to a high level. The above description is provided in U.S. Pat. No. 5,406,139.

FIG. 3 illustrates a third example of a related art input buffer. The third related art input buffer includes the inverter unit 10, a first PMOS transistor 301 having a gate for receiving the externally supplied TTL input signal Din and a source for receiving a ground voltage Vss and an NMOS transistor 302 having a source connected to a drain of the first PMOS transistor 301 and a gate for receiving a power supply voltage Vcc. A second PMOS transistor 303 has a drain connected to a drain of the NMOS transistor 302 and a gate of the pull-up PMOS transistor 101. The second PMOS transistor 303 also has a gate for receiving the output signal Dout of the inverter unit 10, and a source for receiving the power supply voltage Vcc.

With reference to FIG. 3, the operation of the third related art input buffer will now be described. If the externally applied TTL input signal Din is a high level, the pull-down NMOS transistor 102 of the inverter unit 10 is turned on to pull down the output signal DOUT to a low level. Thus, the second PMOS transistor 303 is turned on. Next, the PMOS transistor 101 of the inverter unit 10 is completely turned off by a high level signal outputted from the second PMOS transistor 303. Accordingly, the consumption of the static current can be reduced.

On the other hand, if the input signal Din is a low level, the first PMOS transistor 301 is turned on. Thus, the pull-up PMOS transistor 101 of the inverter unit 10 is turned on to transit the output signal Dout to a high level. The above description is reported in IEEE Journal of Solid State Circuits Vol. 30, No. 5,1995, pages 616–620.

However, in the input buffers according to the first and second examples of the related art, if the pull-up PMOS transistor 101 is not completely turned off and the pull-down NMOS transistor 102 is simultaneously turned on, a bias voltage becomes high when the TTL input signal Din is a high level. In this case, a voltage difference Vgs between the gate and the source of the PMOS transistor 101 becomes much higher than a threshold voltage Vt. Accordingly, the static current is increased and a voltage level of the output signal Dout does not fully become a low level, which disadvantageously consumes the static current.

In the third related art input buffer, when the output signal Dout at a low level is converted to a high level (i.e., an input signal is a low level), the output signal turns on the pull-up PMOS transistor 101 after passing through the two transistors 301 and 302. Accordingly, there is a problem in that a low-to-high transition speed of the output signal Dout is comparatively slow.

The above references are incorporated by reference herein where appropriate for appropriate teachings of additional or alternative details, features and/or technical background.

SUMMARY OF THE INVENTION

An object of the present invention is to provide an input buffer that substantially obviates at least one of the disadvantages or problems of the related art.

Another object of the present invention is to provide an input buffer that accurately converts a TTL logic signal to a CMOS logic signal and controls a CMOS output level.

Another object of the present invention is to provide an input buffer that eliminates static current consumption, even when a bias voltage is changed.

Another object of the present invention is to provide an input buffer that improves a low-to-high speed.

Another object of the present invention is to provide an input buffer for a low current and high-speed operations.

To achieve at least the above objects in a whole or in parts, there is provided an input buffer wherein drains of pull-up PMOS and pull-down NMOS transistors are commonly connected between a power supply voltage and a ground voltage for converting and outputting an externally applied TTL input signal that includes a PMOS control unit for receiving an output signal of the input buffer, for completely turning off the pull-up PMOS transistor when the input signal is a high level, and for rapidly turning on the transistor when the input signal is a low level, thereby enabling rapid transition of the output signal of the input buffer.

To further achieve the above objects, there is provided an input buffer according to the present invention that includes first and second transistors commonly coupled by the second electrodes between a first prescribed voltage and a second prescribed voltage, a third transistor having a control electrode that receives an input signal and a first electrode that receives the second prescribed voltage, a fourth transistor having a control electrode coupled to a second electrode of the third transistor and an output signal of the input buffer, and a first electrode that receives the first prescribed voltage, and a fifth transistor having a second electrode coupled to a second electrode of the fourth transistor and a control of the first transistor, a control electrode that receives a third prescribed voltage, and a first electrode that receives the input signal.

To further achieve the above objects, there is provided an input buffer according to the present invention that includes first and second transistors respectively coupled to a first prescribed voltage and a second prescribed voltage and coupled together by second electrodes, a third transistor having a control electrode that receives an input signal and a first electrode that receives the second prescribed voltage, a fourth transistor having a control electrode coupled to a second electrode of the third transistor and an output signal of the input buffer, and a first electrode that receives the first prescribed voltage, a fifth transistor having control and first electrodes that receive the first prescribed voltage, and a sixth transistor having a control electrode coupled to a second electrode of the fifth transistor, a second electrode commonly coupled to a second electrode of the fourth transistor and the control electrode of the first transistor, and a third electrode that receives the input signal.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
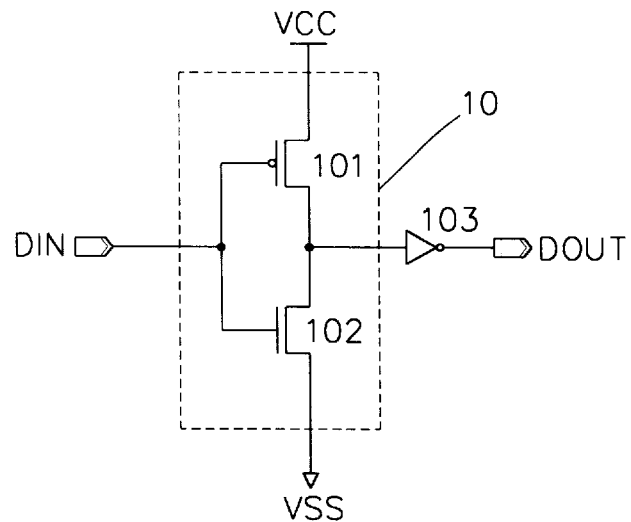
FIG. 1 is a circuit diagram illustrating a first related art input buffer.
Figure 2:
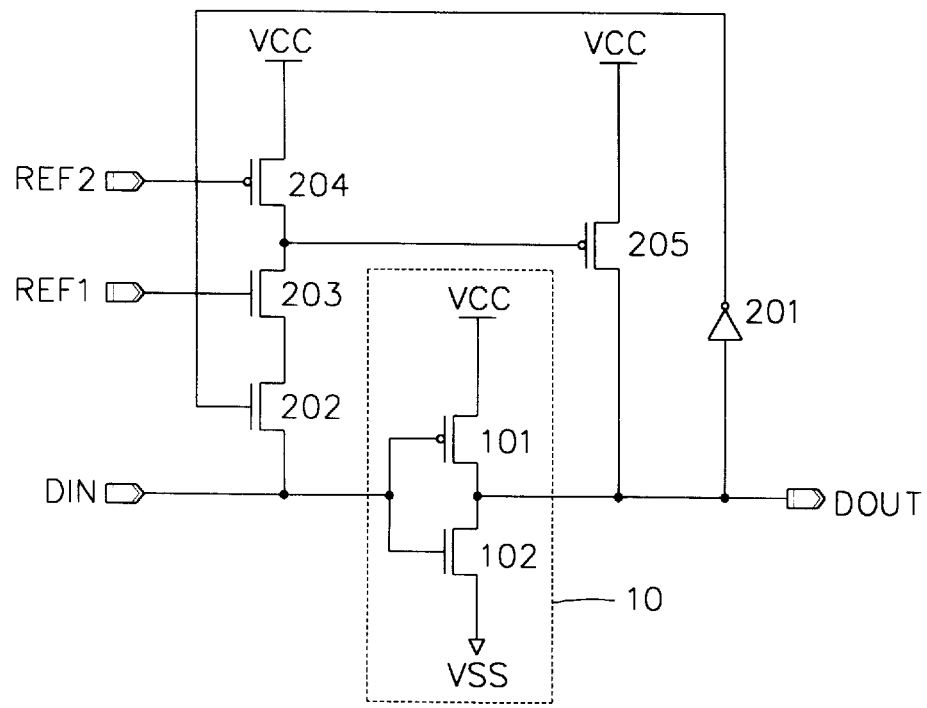
FIG. 2 is a circuit diagram illustrating a second related art input buffer.
Figure 3:
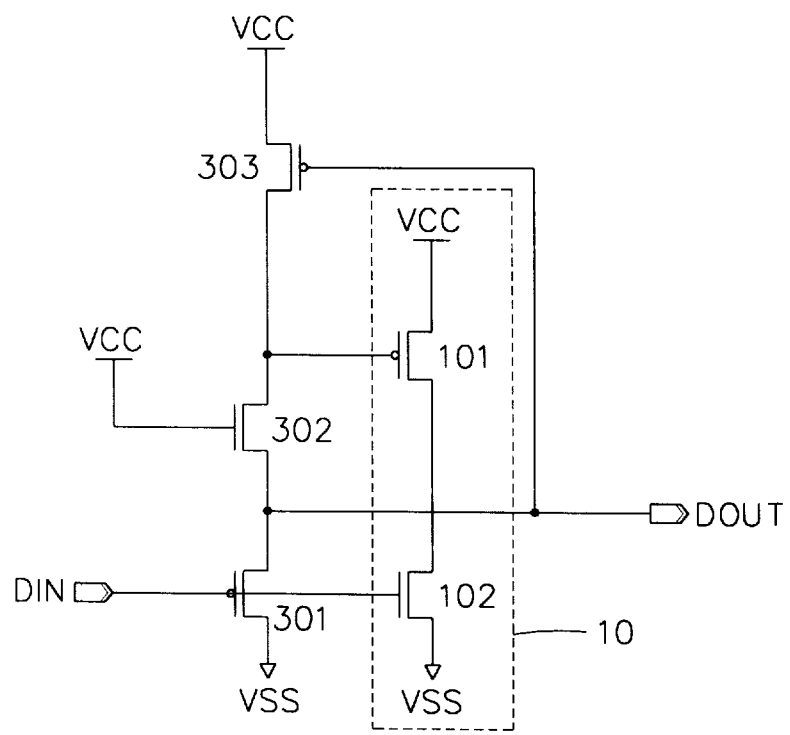
FIG. 3 is a circuit diagram illustrating a third related art input buffer.
Figure 4:
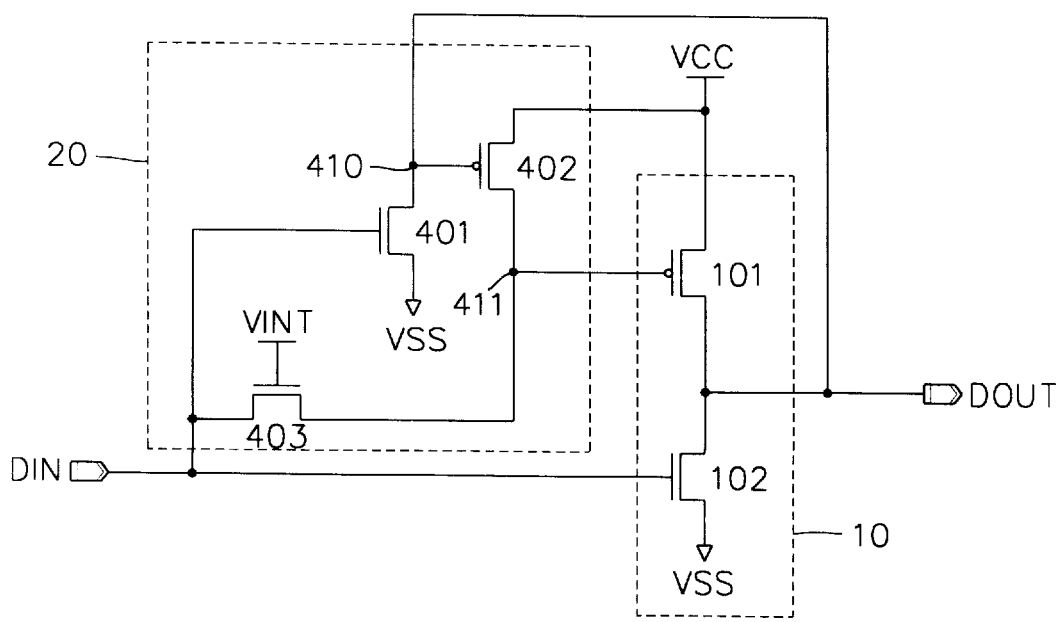
FIG. 4 is a circuit diagram illustrating a preferred embodiment of an input buffer according to the present invention.

FIG. 4 is a circuit diagram illustrating a first preferred embodiment of an input buffer according to the present invention. As shown in FIG. 4, an input buffer includes an inverter unit 10 where commonly coupled drains of a pull-up PMOS transistor 101 and a pull-down NMOS transistor 102 are coupled between a power supply voltage Vcc and a ground voltage Vss. The input buffer that converts and outputs an externally applied TTL input signal Din also includes a PMOS control unit 20 that receives an output signal Dout of the input buffer, and completely turns off the pull-Lip PMOS transistor 101 when an externally applied TTL input signal Din is a high level. The PMOS control unit 20 also rapidly turns on the PMOS transistor 101 when the input signal Din is a low level. Thus, the PMOS control unit 20 controls the pull-up PMOS transistor 101 and enables rapid transition of the output signal of the input buffer.

The PMOS control unit 20 includes a first NMOS transistor 401 having a gate for receiving an external TTL input signal Din and a source for receiving a ground voltage Vss. A PMOS transistor 402 has a gate receiving a drain output of the first NMOS transistor 401 and an output signal Dout of the input buffer and a source receiving a power supply voltage Vcc. A second NMOS transistor 403 has a drain commonly coupled to the drain of the PMOS transistor 402 and the gate of the pull-up PMOS transistor 101. The second NMOS transistor 403 also has a gate receiving an internal power supply voltage Vint and a source receiving the input signal Din. The second NMOS transistor 403 operates to determine whether to pass the input signal Din.

Operations of the first preferred embodiment of the input buffer according to the present invention will now be described with reference to FIG. 4. When the external TTL input signal Din is a high level, a pull-down NMOS transistor 102 is turned on pull down the output signal Dout of the input buffer to a low level. The first NMOS transistor 401 having the gate that receives the input signal Din is turned on and a first node 410 becomes a low level. Then, the PMOS transistor 402 having the gate that receives a signal outputted from the first node 410 is turned on. Thus, a second node 411 becomes a high level.

At the same time, the output signal Dout of a low level is fed back and the first node 410 become a low level, which is a stable state. Further, the second node 411 becomes completely high level in accordance with the first node 410. Accordingly, the pull-up PMOS transistor 101 is completely turned off and no current flows.

In addition, since a difference between the input signal Din and the internal power supply voltage Vint, which is the voltage difference between the second NMOS transistor gate and source, is not greater than a threshold voltage Vt, the second NMOS transistor 403 is turned off. Thus, the pull-up PMOS transistor 101 is affected only by an output of the PMOS transistor 402 of the PMOS control unit 30. Accordingly, the output signal Dout is fully maintained at a low level and the static power is not consumed.

The inner power supply voltage Vint is preferably supplied from an internal power supply voltage generating circuit (not illustrated). However, for an integrated circuit without having the power supply voltage generating circuit in its memory, the inner power supply voltage Vint should be externally supplied.

The inner power supply voltage Vint preferably satisfy the following equation:

$$|TTL_{low}+V_{TH(403)}|<V_{INT}<|TTL_{high}+V_{TH(403)}| \quad (1)$$

The inner power supply voltage Vint should be lower than an externally applied bias voltage. The NMOS transistor 403 is turned on when a voltage of the TTL input signal Din is a low level, and the NMOS transistor 403 is turned off when the input signal Din is high level.

When the input signal Din of a high level is converted to a low level, the pull-down NMOS transistor 102 is turned off, and the first NMOS transistor 401 of the PMOS control unit 20 is also turned off. Since the voltage difference between the input signal Din and internal power supply voltage Vint, which is the second NMOS transistor 403 voltage difference Vgs becomes greater than a threshold voltage Vt, the second NMOS transistor 403 is turned on. The source of the second NMOS transistor receives the input signal Din and rapidly pulls down a voltage level of the node 411. Therefore, the pull-up PMOS transistor 101 is turned on, and the output signal Dout of the input buffer becomes a high level.

At the same time, the output signal Dout, which is pulled up to a high level, is fed back and turns off the PMOS transistor 402 of the PMOS control unit 20. Accordingly, the second node 411 fully becomes a TTL low level in accordance with the second NMOS transistor 403, and the output signal Dout maintains a stable high level. The above-described operations of the first preferred embodiment can be repeatedly performed.

As described above, the switching speed of the first preferred embodiment of the input buffer according to the present invention is improved. Further, static power is not consumed although the externally applied input signal Din is a low level.

A second preferred embodiment of the input buffer according to the present invention is preferably used when there is no power supply generating circuit to generate the inner power supply voltage Vint, which is lower that the externally applied bias voltage, in the same integrated circuit. The second preferred embodiment is also preferably used when external supply of the inner power supply voltage is difficult.

Figure 5:
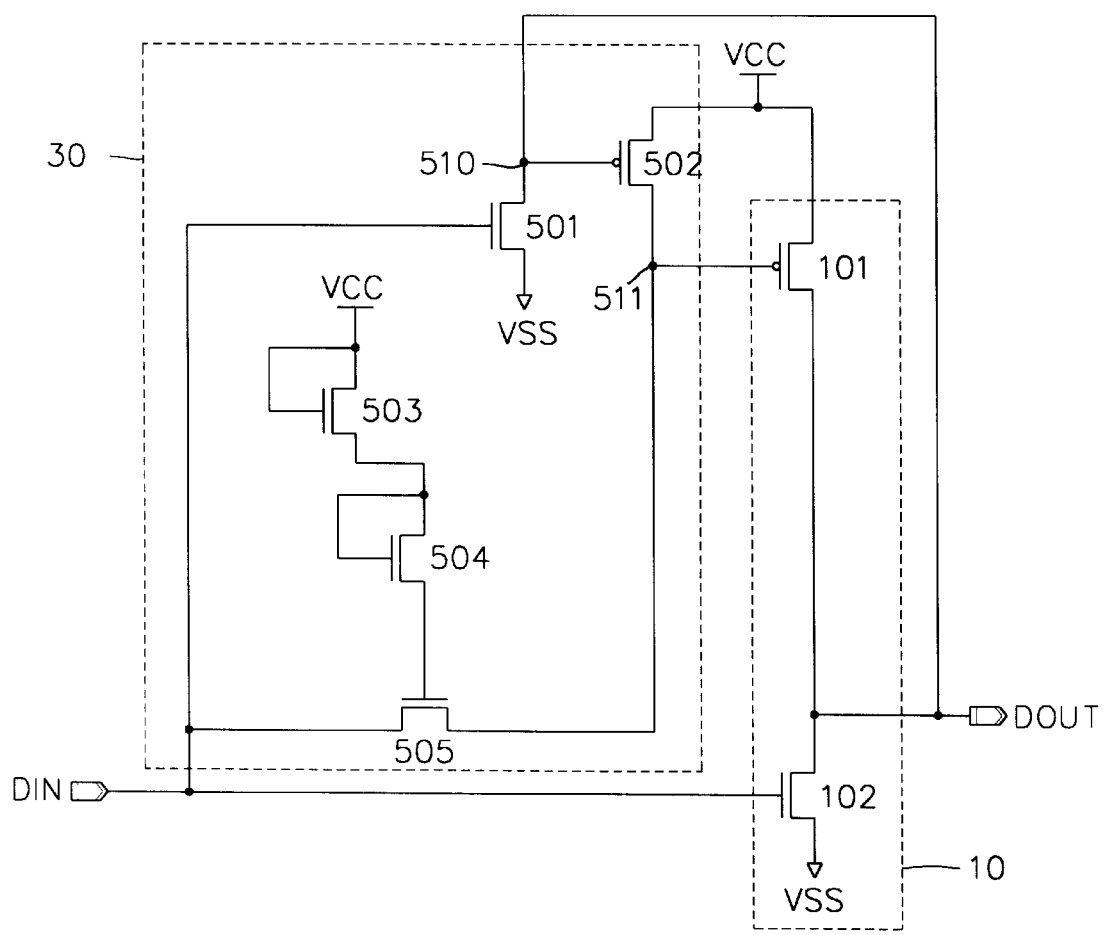
FIG. 5 is a circuit diagram illustrating another preferred embodiment of an input buffer according to the present invention.

FIG. 5 is a circuit diagram illustrating the second preferred embodiment. As shown in FIG. 5, an input buffer includes an inverter unit 10 where commonly coupled drains of a pull-up PMOS transistor 101 and a pull-down NMOS transistor 102 are coupled between a power supply voltage Vcc and a ground voltage Vss. The input buffer that converts and outputs an externally applied TTL input signal Din also includes a PMOS control unit 30 that receives an output signal Dout of the input buffer, and completely turns off the pull-up PMOS transistor 101 when an externally applied TTL input signal Din is a high level. The PMOS control unit 30 also rapidly turns on the PMOS transistor 101 when the input signal Din is a low level. Thus, the PMOS control unit 30 controls the pull-up PMOS transistor 101 and enables rapid transition of the output signal of the input buffer.

The PMOS control unit 30 includes a first NMOS transistor 501 having a gate for receiving an external TTL input signal Din and a source for receiving a ground voltage Vss. A PMOS transistor 502 has a gate that receives a drain output of the first NMOS transistor 501 and an output signal Dout of the input buffer. A source of the PMOS transistor 502 receives a power supply voltage Vcc. A second NMOS transistor 503 has a gate and source that each receive the power supply voltage Vcc. A third NMOS transistor 504 has a gate and source commonly coupled to a drain of the second NMOS transistor 503. A fourth NMOS transistor 505 has a gate coupled to a drain of the third NMOS transistor 504, a drain coupled to a drain of the PMOS transistor 502 and the gate of the pull-up PMOS transistor 101, and a source that receives the input signal Din. The fourth NMOS transistor 505 operates to determine whether to pass the input signal Din.

Operations of the second preferred embodiment of the input buffer according to the present invention will now be described. When the externally applied TTL input signal Din is a high level, the pull-down NMOS transistor 102 is turned on, and the output signal Dout is pulled down at a low level. At the same time, the first NMOS transistor 501 is turned on when the gate receives the input signal Din, and a first node 510 becomes a low level in accordance with an output from the first NMOS transistor 501. The PMOS transistor 502 having the gate that receives a signal outputted from the first node 510 is also turned on to pull up a second node 511 to a high level.

The output signal Dout is fed back and the first node 510 and an output of the first NMOS transistor 501 reach stabilized a low level state. Accordingly, the second node 511 fully becomes a high level by an output of the PMOS transistor 502. The pull-up PMOS transistor 101 is completely turned off so that no current flows.

The second NMOS transistor 503 having the gate for receiving the power supply voltage Vcc is always turned on, and thus the third NMOS transistor 504 is also always turned on, and the fourth NMOS transistor 505 is turned off by the high level input signal Din. Thus, the second node 511 is maintained at a high level only by an output of the PMOS transistor 502. Accordingly, the output signal Dout is fully maintained at a low level and the static power is not consumed.

A threshold voltage drop Vt drop in accordance with the power supply voltage Vcc in the second NMOS transistor 503 and the third NMOS transistor 504 which drives the gate of the fourth NMOS transistor 505, the fourth NMOS transistor 505 is turned on when the input signal Din is a low level and turns off when the input signal Din is a high level. Thus, the fourth NMOS transistor 505 operates similarly to the second NMOS transistor 403 in the first preferred embodiment.

When the input signal Din is a high level, the voltage difference between the gate and the source Vgs becomes smaller than the threshold voltage Vt, thus the NMOS transistor 505 is turned off. If the input signal Din is a low level, the voltage difference Vgs is greater than the threshold voltage Vt, and the NMOS transistor 505 turns on. To obtain an adequate voltage drop with respect to the power supply voltage Vcc based on a transistor fabrication process, the second NMOS transistor 503, third NMOS transistor 504 and fourth NMOS transistor 505 can be coupled in series.

When the TTL input signal Din is converted to a low level, the pull-down NMOS transistor 102 is turned off and the first NMOS transistor 501 is also turned off. The gate of the NMOS transistor 501 receives the input signal Din.

The second NMOS transistor 503 with its gate receiving the power supply voltage Vcc is always turned on, and thus the third NMOS transistor 504 is also always turned on, and the fourth NMOS transistor 505 is turned on in accordance with the output signal of the third NMOS transistor 504 and the low level input signal Din. Thus, the high level second node 511 is rapidly pulled down to a low level, and the pull-up PMOS transistor 101 is turned on by a signal received from the second node 511.

The output signal Dout is pulled up to a high level. Thus, the PMOS transistor 502 in the PMOS control unit 30 is turned off. Accordingly, the second node 511 fully becomes a TTL low level by an output of the fourth NMOS transistor 505 and the pull-up PMOS transistor 101 is completely turned on. In this manner, the output signal Dout fully becomes a high level.

When the input signal Din of a low level is converted to a high level, the above-described operation is again carried out. The operations of the second preferred embodiments of the input buffer can be repeatedly performed.

The switching speed of the second preferred embodiment of the input buffer according to the present invention is improved. Further, static power is not consumed although the externally applied input signal Din is a low level.

The above-described preferred embodiments of the input buffer according to the present invention have various advantages. The preferred embodiments eliminate static current consumption by converting a TTL logic signal to a CMOS logic signal and prevent static current. The preferred embodiments can prevent the static current from increasing even in a change of an external bias voltage. Further, a transition speed (i.e., switching speed) is improved. The input buffer according to the preferred embodiments can widely be applied to a chip, not only to a semiconductor memory, but also to other logic circuits, which are used for high-speed integrated circuits and a low-current devices such as a notebook PC operated by a battery.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. An input buffer having pull-up and pull-down transistors commonly coupled by second electrodes between a first prescribed voltage and a second prescribed voltage converts and outputs an input signal, the input buffer comprising:
   a control unit that receives an output signal of the input buffer, wherein the control unit turns off the pull-up transistor when the input signal is a high level, and turns on the pull-up transistor when the input signal is a low level to generate the output signal of the input buffer, wherein the control unit comprises:
      a first transistor having a control electrode that receives the input signal and a first electrode that receives the second prescribed voltage;
      a second transistor having a control electrode coupled to a second electrode of the first transistor and the output signal of the input buffer, and a first electrode that receives the first prescribed voltage; and
      a third transistor having a second electrode coupled to the pull-up transistor, a control electrode that receives a third prescribed voltage, and a first electrode that receives the input signal, wherein the third transistor has the second electrode coupled to a second electrode of the second transistor and a control electrode of the pull-up transistor.

2. The input buffer of claim 1, wherein the third transistor operates as a pass transistor based on the input signal.

3. The input buffer of claim 1, wherein the third prescribed voltage turns off the third transistor when the input signal is a high voltage level and turns on the third transistor when the input signal is a low voltage level.

4. The input buffer of claim 1, wherein the third prescribed voltage is an internal power supply voltage having a lower level than a bias voltage.

5. The circuit of claim 1, wherein a voltage difference between the control and first electrodes of the third transistor is smaller than a transistor threshold voltage when the input signal is a high level and the voltage difference is greater than the transistor threshold voltage when the input signal is a low level.

6. The input buffer of claim 1, wherein the first, second and control electrodes are respectively source, drain and gate electrodes, wherein the first and third transistors are NMOS transistors and the second transistor is a PMOS transistor.

7. The input buffer of claim 1, wherein the control unit further comprises:
   a fourth transistor having control and first electrodes that receive the first prescribed voltage;
   a fifth transistor having a control electrode and a first electrode commonly coupled to a second electrode of the fourth transistor; and
   wherein the third transistor has the control electrode coupled to a second electrode of the fifth transistor.

8. The input buffer of claim 7, wherein the third transistor operates as a pass transistor based on the input signal.

9. The input buffer of claim 7, wherein the fifth transistor and the fourth transistor drop the first prescribed voltage to supply a voltage lower than an external bias voltage to the control electrode of the third transistor.

10. The input buffer of claim 7, wherein the fifth transistor is series coupled to an additional transistor to obtain a prescribed voltage drop relative to the first prescribed voltage.

11. The input buffer of claim 7, wherein when the input signal is a high level a voltage difference between the control and first electrodes of the third transistor is smaller than a threshold voltage to turn off the third transistor, and wherein when the input signal is a low level the voltage difference of the third transistor is larger than the threshold voltage to turn on the third transistor.

12. The input buffer of claim 1, wherein the pull-up and pull-down transistors are respectively PMOS and NMOS transistors, wherein the first prescribed voltage is a power supply voltage and the second prescribed voltage is a ground voltage, wherein the input signal is a TTL signal, and wherein the output signal is a CMOS signal.

13. An input buffer comprising:
   first and second transistors respectively coupled to a first prescribed voltage and a second prescribed voltage, and coupled together by respective second electrodes thereof;
   a third transistor having a control electrode that receives an input signal and a first electrode that receives the second prescribed voltage;
   a fourth transistor having a control electrode coupled to a second electrode of the third transistor and an output signal of the input buffer, and a first electrode that receives the first prescribed voltage; and
   a fifth transistor having a second electrode coupled to a second electrode of the fourth transistor and a control electrode of the first transistor, a control electrode that receives a third prescribed voltage, and a first electrode that receives the input signal.

14. The input buffer of claim 13, wherein the second transistor receives the input signal at a control electrode and outputs the output signal at the second electrode, wherein the third prescribed voltage turns off the fifth transistor when the input signal is a high voltage level and turns on the fifth transistor when the input signal is a low voltage level.

15. The input buffer of claim 13, wherein the input buffer turns off the first transistor when the input signal is a high level, and rapidly turns on the first transistor when the input signal is a low level to increase a switching speed of the input buffer.

16. An input buffer comprising:
   first and second transistors respectively coupled to a first prescribed voltage and a second prescribed voltage, and coupled together by second electrodes;
   a third transistor having a control electrode that receives an input signal and a first electrode that receives the second prescribed voltage;
   a fourth transistor having a control electrode coupled to a second electrode of the third transistor and an output signal of the input buffer, and a first electrode that receives the first prescribed voltage;
   a fifth transistor having control and first electrodes that receive the first prescribed voltage;
   a sixth transistor having a control electrode and a first electrode commonly coupled to a second electrode of the fifth transistor; and
   a seventh transistor having a control electrode coupled to a second electrode of the sixth transistor, a second electrode commonly coupled to a second electrode of the fourth transistor and the control electrode of the first transistor, and a third electrode that receives the input signal.

17. The input buffer of claim 16, wherein the input buffer turns off the first transistor when the input signal is a high level, and rapidly turns on the first transistor when the input signal is a low level to increase a switching speed of the input buffer.

18. The input buffer of claim 1, wherein the first transistor has a second electrode that receives the output signal of the input buffer, and wherein the third prescribed voltage is between the first and second prescribed voltages.

19. The input buffer of claim 1, wherein the second transistor is enabled based on the input signal, and wherein the third prescribed voltage is between the first and second prescribed voltages.

20. An input buffer having pull-up and pull-down transistors commonly coupled by second electrodes between a first prescribed voltage and a second prescribed voltage converts and outputs an input signal, the input buffer comprising:
   a control unit that receives an output signal of the input buffer, wherein the control unit turns off the pull-up transistor when the input signal is a high level, and turns on the pull-up transistor when the input signal is a low level to generate the output signal of the input buffer, wherein the control unit comprises,
      a third transistor having a second electrode coupled to the pull-up transistor, a control electrode that receives a third prescribed voltage, and a first electrode that receives the input signal,
      a first transistor connected between the input signal and the second prescribed voltage, and
      a second transistor connected to the first transistor and the first prescribed voltage, wherein the third transistor has the second electrode coupled to a second electrode of the second transistor and a control electrode of the pull-up transistor, and wherein the third prescribed voltage does not equal the first and second prescribed voltages.

21. An input buffer having pull-up and pull-down transistors commonly coupled by second electrodes between a first prescribed voltage and a second prescribed voltage converts and outputs an input signal, the input buffer comprising:
   a control unit that receives an output signal of the input buffer, wherein the control unit turns off the pull-up transistor when the input signal is a high level, and turns on the pull-up transistor when the input signal is a low level to generate the output signal of the input buffer, wherein the control unit comprises,
      a first transistor having a control electrode that receives the input signal, a first electrode that receives the second prescribed voltage and a second electrode that receives the output signal of the input buffer,
      a second transistor coupled between the first transistor and the control electrode of the pull-up transistor, and
      a third transistor having a second electrode coupled to the pull-up transistor, control electrode that receives a third prescribed voltage, and a first electrode that receives the input signal, wherein the third transistor has the second electrode coupled to a control electrode of the pull-up transistor, and wherein the third prescribed voltage is between the first and second prescribed voltages.

* * * * *